United States Patent [19]

Batdorf et al.

[11] Patent Number: 5,374,590
[45] Date of Patent: Dec. 20, 1994

[54] FABRICATION AND LASER DELETION OF MICROFUSES

[75] Inventors: Kerry L. Batdorf, Poughkeepsie, N.Y.; Richard A. Gilmour, Colchester, Vt.; Paul Tsang, Poughkeepsie, N.Y.

[73] Assignee: International Business Machines Corporation, Armonk, N.Y.

[21] Appl. No.: 53,282

[22] Filed: Apr. 28, 1993

[51] Int. Cl.⁵ .......................... H01L 21/268
[52] U.S. Cl. .................... 437/173; 437/922
[58] Field of Search ................ 437/173, 922

[56] References Cited

U.S. PATENT DOCUMENTS

| | | | |
|---|---|---|---|
| 4,240,094 | 12/1980 | Mader | 437/173 |
| 4,338,590 | 7/1982 | Connolly, Jr. et al. | 340/347 CC |
| 4,387,503 | 6/1983 | Aswell et al. | 437/173 |
| 4,476,375 | 10/1984 | Ogawa | 219/121.72 |
| 4,745,258 | 5/1988 | Arima | 219/121.67 |
| 4,862,243 | 8/1989 | Welch et al. | 357/51 |
| 4,882,293 | 11/1989 | Naumann et al. | 437/52 |
| 5,096,850 | 3/1992 | Lippitt, III | 437/173 |

FOREIGN PATENT DOCUMENTS

| | | | |
|---|---|---|---|
| 90565 | 10/1983 | European Pat. Off. | 437/173 |
| 272799 | 6/1988 | European Pat. Off. | 437/173 |
| 194740 | 8/1986 | Japan | 437/173 |
| 16544 | 1/1987 | Japan | 437/173 |

OTHER PUBLICATIONS

Related U.S. patent application Ser. No. 07/990,679 filed Dec. 15, 1992 entitled "Structure and Fabrication of SiCr Microfuses" IBM Docket No. FI9-90-054.

S. Wolf et al. Silicon Processing for the VLSI ERA vol. I: Process Technology Lattice Press, Sunset Beach, Calif. 1986 pp. 407–409.

Primary Examiner—R. Bruce Breneman
Assistant Examiner—Linda J. Fleck
Attorney, Agent, or Firm—Harold Huberfeld

[57] ABSTRACT

A method of fabricating a microfuse, deletable by laser pulses utilizes laser pulses of a predetermined spot diameter and beam alignment accuracy. A fusible link forming a portion of the microfuse is defined such that its length is at least equal to the sum of the laser spot diameter and the beam alignment accuracy and its width is no greater than half the laser spot diameter. A method of deleting the microfuse by laser pulses is provided where the microfuse has a predetermined composition, length and width having an axis bisecting the width and parallel to the length and is covered with a passivation layer at least 3 $\mu$m thick. The method includes adjusting the diameter of the beam of laser light (i) to at least a minimum diameter of $W+\Delta P_w$, where $W$ equals the width of the microfuse fuse link and $\Delta P_w$ equals the accuracy of the beam in the direction of W and (ii) to no more than a maximum diameter of $L+\Delta P_L$, where $L$ equals the length of the microfuse fuse link and $\Delta P_L$ equals the accuracy of the beam in the direction of L.

5 Claims, 3 Drawing Sheets

FABRICATION AND LASER DELETION OF MICROFUSES

RELATED APPLICATIONS

This application is related to U.S. patent application Ser. No. 07/990,679 filed Dec. 15, 1992, and entitled "Structure and Fabrication of SiCr Microfuses", assigned to the assignee of the present invention.

BACKGROUND OF THE INVENTION

The present invention relates generally to the fabrication and laser deletion of microfuses and more particularly to a process for fabricating a microfuse within an integrated circuit and deleting such microfuse by one or more laser pulses.

The use of microfuses in digital integrated circuits is well known for the purpose of selectively disconnecting unwanted components from the circuit. A known technique for deleting such fuses from the circuit involves the application of a laser light beam to the microfuse fuse link having sufficient energy to melt the fuse link. Such a technique has traditionally involved reducing or removing any passivation oxide present over the fuse link structure, thereby creating a window to facilitate the deletion of the fuse. During the fuse-deletion process, a crater is typically formed exposing the remains of the disintegrated fuse to the surrounding area. This process has the potential to cause many adverse effects to the portion of the integrated circuit in proximity to the deleted fuse, such as delamination of the circuit, contamination of the circuit with deleted particles, and corrosion. In addition, it has been difficult to obtain a satisfactory yield of deleted fuses using such prior techniques.

SUMMARY OF THE INVENTION

A feature of the present invention is the provision of a process for deleting microfuses from an integrated circuit structure with a laser light source which eliminates the need for opening a window to gain access to the fuse.

Another feature of the present invention is the provision of such a method of deleting a microfuse for interconnecting the components of an integrated circuit in a desired manner which yields a high rate of deleted fuses.

A further feature of the present invention is the provision of such a method of deleting microfuses for interconnecting the components of an integrated circuit in a desired manner which eliminates adverse effects to the surrounding integrated circuit areas such as delamination, contamination, and corrosion.

Yet another feature of the present invention is a method of fabricating a microfuse which is deletable by laser pulses of a predetermined spot diameter and beam alignment accuracy to achieve the aforementioned features.

Accordingly, a method of fabricating a microfuse deletable by laser pulses of a predetermined spot diameter and beam alignment accuracy is provided for interconnecting the components of an integrated circuit in a desired manner. The method includes the steps of: (a) depositing a fusible film on a substrate to a predetermined thickness; (b) depositing a mask layer of photoresist material on the fusible film layer to define the size of a fusible link forming a portion of the microfuse, such that the length of the fusible link is at least equal to the sum of the predetermined laser spot diameter and the predetermined beam alignment accuracy, and such that the width of the fusible link is no greater than half the predetermined laser spot diameter; and, (c) etching away a portion of the fusible film layer exposed by the photoresist mask thereby forming the microfuse including the fusible link.

Additionally, a method of deleting a microfuse for interconnecting the components of an integrated circuit in a desired manner is provided wherein the microfuse has a predetermined composition, length and width, and an axis bisecting the width and parallel to the length, and is covered by a passivation layer having a thickness of at least three micrometers. The method includes the steps of: (a) generating a beam of laser light from having an adjustable diameter and an inherent accuracy with respect to a target at a given distance; (b) positioning the laser source at a predetermined distance from the microfuse thereby establishing the accuracy at which the beam can be directed at the microfuse; (c) adjusting the diameter of the beam (i) to at least a minimum diameter of $W + \Delta P_L$, where W equals the width of the microfuse fuse link and $\Delta P$ equals the accuracy of the beam in a direction perpendicular to the link axis and (ii) to no more than a maximum diameter of $L + \Delta P_L$, where L equals the length of the microfuse fuse link and $\Delta P_L$ equals the accuracy of the beam in a direction parallel to the link axis; and (d) directing the adjusted laser beam at the microfuse fuse link through the passivation layer at a predetermined energy level to thereby delete the microfuse.

Other advantages and novel features of the present invention will become apparent from the following detailed description of the invention when considered in conjunction with the accompanying drawings.

DETAILED DESCRIPTION OF THE PREFERRED EMBODIMENTS OF THE INVENTION

Figure 1A:
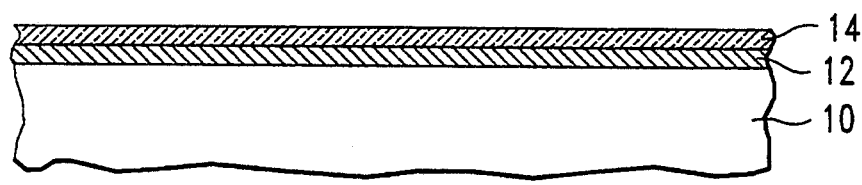
FIGS. 1A through 1E illustrate in schematic form the steps employed in the method of manufacturing a microfuse in accord with the present invention.

Referring now to the drawings, the invention will first be described in connection with fabricating a microfuse which is deletable by laser pulses of a predetermined spot diameter and beam accuracy. The basic fabrication steps are the same as those described and claimed in U.S. application Ser. No. 07/990,679 to Carruthers, et al, filed Dec. 15, 1992, and assigned to the assignee of the present invention.

Referring to FIG. 1A, the surface of a substrate 10 is cleaned, for example, in a BHF bath, and then in-situ sputter cleaned. A thin film 12 of a passivation layer, such as silicon dioxide, is preferably grown on the clean surface of substrate 10. A fusible film 14 is deposited on the passivation layer 12 by the sputter deposition, preferably, of a SiCr film to a thickness, preferably in the range of 300 angstroms to 750 angstroms from a target composed preferably of approximately 28 percent Cr and 72 percent Si. The film is amorphous as deposited. It transforms to a polycrystalline structure after being annealed at or above 280° C. for 30 minutes or longer. The polycrystalline film consists of chromium disilicide (CrSi2) supersaturated with Si soluble atoms.

Figure 1B:
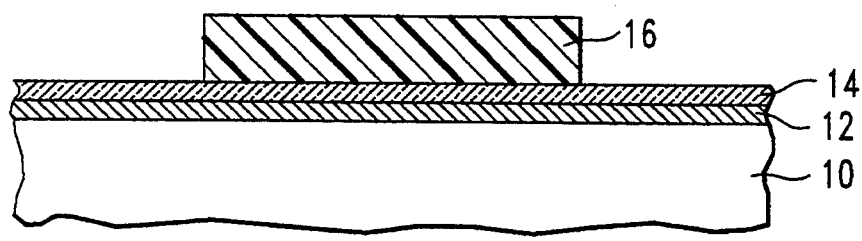

As shown in FIG. 1B, a fuse pattern in photoresist layer 16 is defined on the surface of the SiCr layer 14 using standard photolithographic techniques. The particular parameters used to define the features of each fuse in layer 16 are a critical feature of the present invention and will be described in more detail in connection with FIGS. 2, 3, 4, and 5.

Figure 1C:
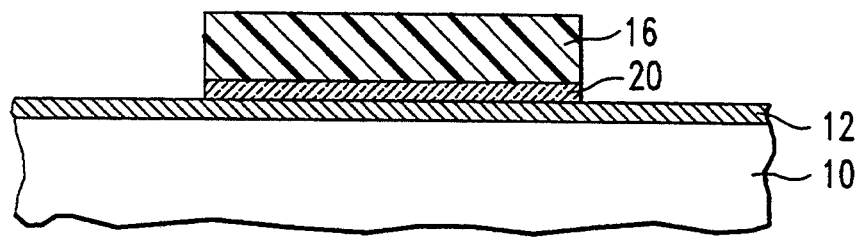
Figure 1D:
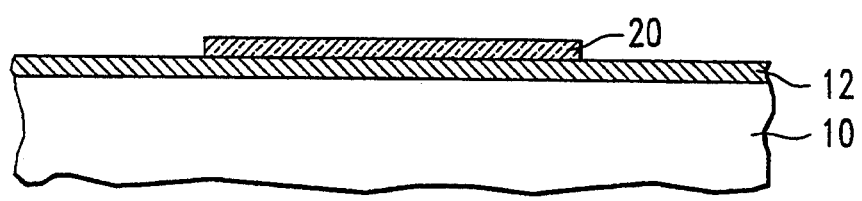

As shown in FIG. 1C, the exposed surface of the SiCr layer 14 is etched away, preferably using a reactive ion etching (also called plasma etching) technique in an O2/CF4 mixture to define the fuse pattern 20. The photoresist 16 is then removed, as shown in FIG. 1D thereby exposing the fuse pattern 20. The fuse pattern 20 includes a plurality of microfuses, each containing a fusible link.

Figure 1E:
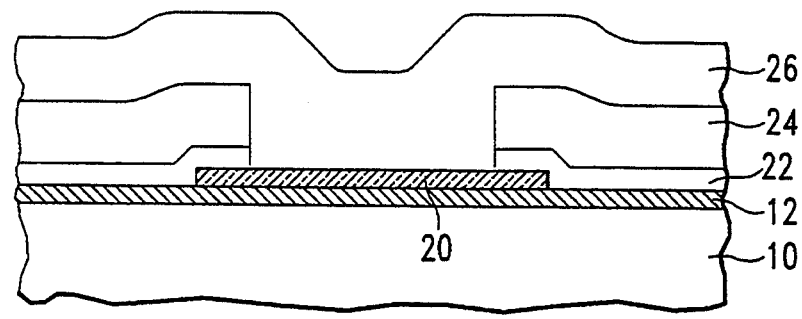

As shown in FIG. 1E, the remaining steps of the microfuse fabrication process of the present invention will be described. The fuse layer 20 is sputter cleaned and then a final metallization layer is deposited over the surface of the substrate 10 and the microfuse pattern 20. The final metallization layer is preferably a bi-layer formed by first in-situ depositing a layer 22 of tungsten to a thickness of approximately 100 nanometers, completely covering the surface. A final layer 24 of an aluminum alloy, for example, the Ti/AlCu/Ti/AlCu alloy called TACTAC is deposited by sputtering over the entire surface of the tungsten layer 22. Using standard photolithographic techniques, the final metal pattern is shown.

The resulting structure is now annealed at a temperature in the range of 350° C.–450° C. for a period of 30–90 minutes. Then a final passivation layer 26 of SiO2 is deposited over the entire surface of the structure to a thickness of at least 3.0 μm.

Figure 2:
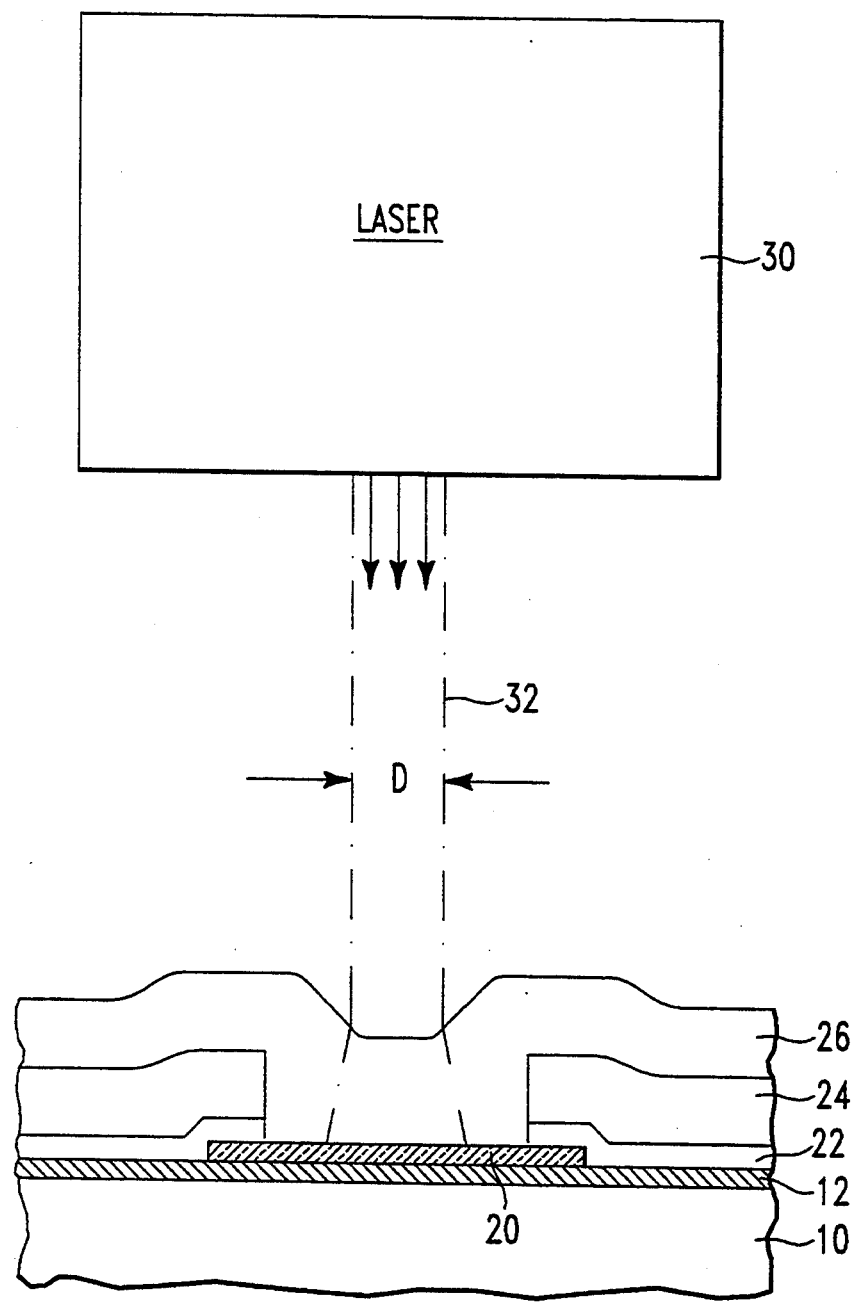
FIG. 2 illustrates in schematic form a method of deleting a microfuse in accord with the present invention.

Referring to FIG. 2 to further understand the method heretofore described, a laser 30 is positioned at a predetermined distance from the microfuse pattern 20 thereby establishing the accuracy at which a laser beam can be directed at a particular microfuse. Laser 30 is preferably a YAG infra-red laser admitting light at a wave length of 1.064 μm in a focused columnar laser beam 32 having a diameter D. In the method described in connection with FIGS. 1A–E, the diameter D of beam 32 is predetermined.

Figures 3, 4:
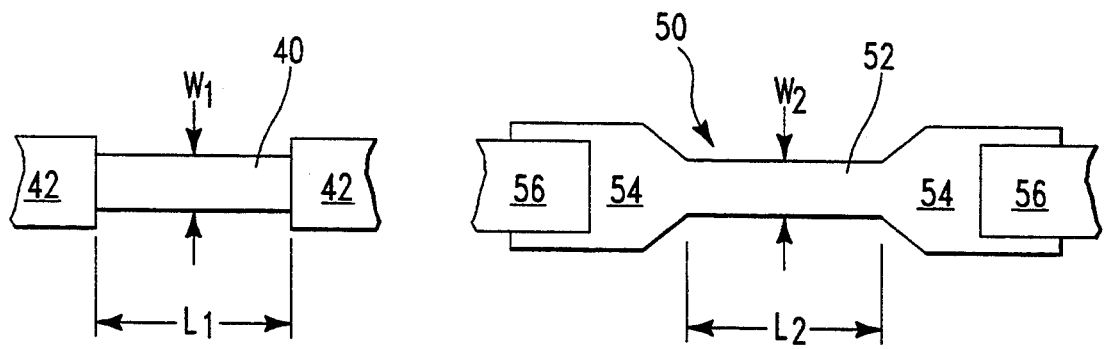
FIGS. 3 and 4 illustrate top schematic views of microfuse shapes and dimensions in accord with the present invention.

Referring to FIG. 3, a first microfuse 40 is shown having a rectangular shape wherein the length $L_1$ is determined by the distance between the metallization terminals 42. The fuse link 40 has a width $W_1$. In FIG. 4 a preferred embodiment of a microfuse 50 is barbell shaped and includes a fuse link portion 52 having a length $L_2$ determined by the distance between flared portions 54. The flared portions 54 are in turn connected to metallization terminals 56. The fuse link 52 has a width $W_2$.

Figure 5:
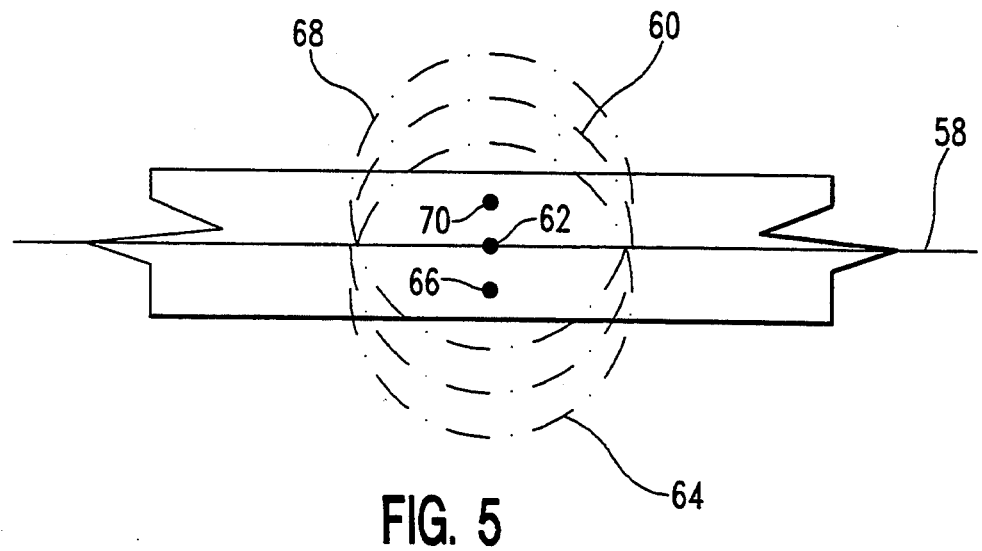
FIG. 5 illustrates a top schematic view of a method of deleting a microfuse in accord with the present invention.

Referring to FIGS. 1B and 1C, the photoresist 16 defines a fuse pattern 20 wherein each fuse has a fusible link portion 40 or 52, as shown in FIGS. 3 and 4, having a length at least equal to the sum of the predetermined laser spot diameter D and the predetermined laser beam alignment accuracy. The width of the fusible link is defined to be no greater than half the predetermined laser spot diameter D as shown in FIG. 5. As is shown in FIG. 2, the passivation layer 26 has a refraction or interference effect on the beam 32, causing the spot diameter to increase at the plane of pattern 20.

In a second embodiment of the present invention, a method is provided for deleting a microfuse interconnecting the components of an integrated circuit in a desired manner. In this embodiment, the diameter D of the laser beam 32 is preferably adjustable and the microfuse has a predetermined composition, length, and width, and is covered with a passivation layer, having a thickness of at least 3 μm as shown in FIG. 2. The beam 32 has an inherent accuracy with respect to the target fuse pattern 20 at a given distance between the laser 30 and the fuse pattern 20. The diameter of the laser beam may then be adjusted so that the minimum diameter is at least equal to $W + \Delta P_w$ where W equals the width of the microfuse, shown in FIG. 5, and $\Delta P_w$ equals the accuracy of the laser beam in the direction of W. The maximum diameter of the beam is preferably $L + \Delta P_L$ where L equals the length of the microfuse shown in FIG. 5 and $\Delta P_L$ equals the accuracy of the beam in the direction of L. The direction of L coincides with the axis 58 of the fuse link 52 or 40 and is perpendicular to the direction of W. The axis 58 bisects the width W and is parallel to the length L of the link 52 or 40. The adjusted laser beam is directed at the microfuse through the passivation layer 26 at a predetermined energy level to delete the microfuse. The predetermined energy level is preferably between 0.5 and 0.6 μJ. Preferably such laser pulses have a duration of between 10 and 100 nanoseconds and preferably approximately 15 to 30 nanoseconds. The preferred method of practicing this embodiment of the invention is to direct three distinct beams at the microfuse, wherein the first beam 60 is directed at the center 62 of the microfuse. A second beam 64, equal in strength to the first beam 60, is then directed through the passivation layer 26 at a point 66 on the microfuse offset from the center 62 of the microfuse in the direction of W, perpendicular to the axis 58, preferably between one half the minimum beam diameter and one half the maximum beam diameter. Finally, a third adjusted laser beam 68 is directed at the microfuse through the passivation layer 26 at a point 70 on the microfuse offset from the center 60 by between one half the minimum beam diameter and one half the maximum beam diameter also in the direction of W but opposite to the offset of the second beam 64.

TABLE I shows an example of the relationship between beam size and yield—i.e. the percentage of successfully deleted fuses—used in establishing the beam size parameters of the present invention.

TABLE 1

| BEAM SIZE (μM) | YIELD (%) OF DELETED FUSES | | | |
|---|---|---|---|---|
| | 3.0 | 5.0 | 6.0 | 9.0 |
| ARRAY 1 | 100 | 84 | 65 | 79 |
| ARRAY 2 | 100 | * | 55 | 66 |
| DISCRETE | 100 | 95 | 100 | 96 |

Fuse Dimensions (μm): L = 3.7, W = 1.5
ARRAY 1 = 24 Fuses/6.4 μm Pitch
ARRAY 2 = 24 Fuses/14 μm Pitch
*Not measured
$\Delta P_L = P_W = 0.5$ μm In this manner, a highly efficient process has been developed for deleting microfuses by means of a laser technique through the passivation layer of the integrated circuit containing such fuses. This process eliminates the need for opening a window in the passivation layer, yields a high rate of deleted fuses, and eliminates adverse effects to the surrounding integrated circuit areas.

While there have been described what are at present considered to be the preferred embodiments of the present invention, it will be obvious to those skilled in the art that various changes and modifictions may be made therein, without departing from the invention, and it is, therefore, aimed in the appended claims to cover all such changes and modifications as follow in the true spirit and scope of the present invention.

What is claimed is:

1. A method of deleting a microfuse for interconnecting the components of an integrated circuit in a desired manner, said microfuse having a fuse link with a length and width having an axis bisecting the width and parallel to the length, and being covered by a passivation layer having a thickness of at least 3.0 $\mu$m, said method comprising the steps of:
    a) generating a beam of laser light having an adjustable diameter and an inherent accuracy with respect to a target at a given distance;
    b) positioning said laser source at a distance from said microfuse thereby establishing the accuracy at which said beam can be directed at said microfuse;
    c) adjusting the diameter of said beam (i) to at least a minimum diameter of $$W + \Delta P_w,$$

where, W equals the width of said microfuse fuse link and $\Delta P_w$ equals the accuracy of said beam in a direction perpendicular to said axis
    and (ii) to no more than a maximum diameter of $$L + \Delta P_L,$$

where, L equals the length of said microfuse fuse link, and
    $\Delta P_L$ equals the accuracy of said beam in the direction parallel to said axis, and
    d) directing said adjusted laser beam at said microfuse fuse link, through said passivation layer to thereby delete said microfuse while leaving said passivation layer in place with said thickness of at least 3.0 $\mu$m.

2. The method of claim 1 wherein said adjusted laser beam energy level is between 0.5 and 0.6 $\mu$J.

3. The method of claim 1 wherein said adjusted laser beam is directed at the center of said microfuse fuse link.

4. The method of claim 3 further including the step of:
    e) directing a second said adjusted laser beam at said microfuse, through said passivation layer, wherein said second beam is directed at a point on said microfuse fuse link offset from said center by between one half said minimum beam diameter and one half said maximum beam diameter in a direction perpendicular to said axis.

5. The method of claim 4 further including the step of:
    f) directing a third said adjusted laser beam at said microfuse, through said passivation layer, wherein said third beam is directed at a point on said microfuse fuse link offset from said center by between one half said minimum beam diameter and one half said maximum beam diameter, wherein said third beam is offset from said center in a direction opposite to the offset of said second beam in a direction perpendicular to said axis.

* * * * *